(12) United States Patent
Han et al.

(10) Patent No.: US 12,514,055 B2
(45) Date of Patent: Dec. 30, 2025

(54) INORGANIC PEROVSKITE QUANTUM DOT-BASED SOLAR CELL INCLUDING NANOSTRUCTURED BACK ELECTRODE AND METHOD OF MANUFACTURING THE SAME

(71) Applicants: DAEGU GYEONGBUK INSTITUTE OF SCIENCE AND TECHNOLOGY, Daegu (KR); KOOKMIN UNIVERSITY INDUSTRY ACADEMY COOPERATION FOUNDATION, Seoul (KR)

(72) Inventors: Sanghun Han, Daegu (KR); Jongmin Choi, Daegu (KR); Younghoon Kim, Seoul (KR)

(73) Assignees: DAEGU GYEONGBUK INSTITUTE OF SCIENCE AND TECHNOLOGY, Daegu (KR); KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 0 days.

(21) Appl. No.: 18/129,467

(22) Filed: Mar. 31, 2023

(65) Prior Publication Data
US 2023/0354622 A1 Nov. 2, 2023

(30) Foreign Application Priority Data
Mar. 31, 2022 (KR) .................. 10-2022-0040061

(51) Int. Cl.
*H10K 30/50* (2023.01)
*H01G 9/00* (2006.01)
(Continued)

(52) U.S. Cl.
CPC ........... *H10K 30/50* (2023.02); *H01G 9/0029* (2013.01); *H01G 9/2022* (2013.01); *H10K 71/13* (2023.02);
(Continued)

(58) Field of Classification Search
CPC ........ H10K 30/50; H10K 71/13; H10K 71/20; H10K 85/624; H10K 85/633;
(Continued)

(56) References Cited

U.S. PATENT DOCUMENTS

2020/0325391 A1\* 10/2020 Kim ................. H01L 33/26

FOREIGN PATENT DOCUMENTS

| KR | 10-2018-0064858 A | 6/2018 |
|---|---|---|
| KR | 10-2020-0008813 A | 1/2020 |
| KR | 10-2248636 B1 | 5/2021 |

OTHER PUBLICATIONS

Wei ("Enhanced Light Harvesting in Perovskite Solar Cells by a Bioinspired Nanostructured Back Electrode") Adv. Energy Mater. 2017, 7, 1700492 (Year: 2017).\*

(Continued)

*Primary Examiner* — Angelo Trivisonno
(74) *Attorney, Agent, or Firm* — Hauptman Ham, LLP

(57) ABSTRACT

The present invention relates to an inorganic perovskite quantum dot-based solar cell capable of providing a significantly excellent photoelectric conversion efficiency compared to the related art by increasing a light absorption capacity even though a photoactive layer has a limited thickness. Specifically, the inorganic perovskite solar cell may include: an electron transport layer that is disposed on a transparent electrode; a photoactive layer having a flat structure that is disposed on the electron transport layer and includes inorganic perovskite quantum dots; an organic hole transport layer that is disposed on the photoactive layer and (Continued)

includes nanopatterns; and a back electrode that is disposed on the organic hole transport layer.

7 Claims, 14 Drawing Sheets

(51) Int. Cl.
    *H01G 9/20*          (2006.01)
    *H10K 71/13*         (2023.01)
    *H10K 71/20*         (2023.01)
    *H10K 85/60*         (2023.01)

(52) U.S. Cl.
    CPC ........... *H10K 71/20* (2023.02); *H10K 85/624* (2023.02); *H10K 85/633* (2023.02)

(58) Field of Classification Search
    CPC ...... H10K 85/615; H10K 30/86; H10K 30/40; H10K 85/626; H10K 30/10; H10K 30/81; H10K 71/12; H01G 9/0029; H01G 9/2022; Y02E 10/549
    See application file for complete search history.

(56) References Cited

OTHER PUBLICATIONS

Abdelraouf ("Front dielectric and back plasmonic wire grating for efficient light trapping in perovskite solar cells"), Optical Materials 86 (2018) 311-317 (Year: 2018).*

Han ("A small-molecule-templated nanostructure back electrode for enhanced light absorption and photocurrent in perovskite quantum dot photovoltaics") J. Mater. Chem. A, 2022, 10, 8966-8974 (Year: 2022).*

Atalla ("Plasmonic Absorption Enhancement in a Dye-Sensitized Solar Cell Using a Fourier Harmonics Grating") Plasmonics (2015) 10:151-156 (Year: 2015).*

Han et al., "Nanostructured Hole-Transporting Layer Enhances Light-Trapping Effect in CsPbI3 Perovskite Quantum Dot Solar Cells," Poster Presentation in the Polymer Society of Korea, Apr. 7, 2021, 6 pages.

Han et al., "Light Absorption Improvement in Nanostructrued Backside Perovskite Quantum Dot Photovoltaics," Poster Presentation in the Polymer Society of Korea, Oct. 22, 2021, 12 pages.

Oh et al., "Hexagonal array micro-convex patterned substrate for improving diffused transmittance in perovskite solar cells," Thin Solid Films, 2018, 21 pages.

Baek et al., "Nanostructured Back Reflectors for Efficient Colloidal Quantum-Dot Infrared Optoelectronics," Advanced Materials, 2019, 1901745, 7 pages.

Han et al., "A small-molecule-templated nanostructure back electrode for enhanced light absorption and photocurrent In perovskite quantum dot photovoltaics," Journal of Materials Chemistry A, Mar. 17, 2022, 9 pages.

Huh et al., "Selectively patterned TiO2 nanorods as electron transport pathway for high performance perovskite solar cells," Nano Research, 2018, 6 pages.

Sinyoung Cho et al., "High-Voltage and Green-Emitting Perovskite Quantum Dot Solar Cells via Solvent Miscibility-Induced Solid-State Ligand Exchange", Chemistry of Materials. 2020, vol. 32, cited in NPL No. 2, pp. 8808-8818.

Korean Office Action issued on Jan. 29, 2024, in connection with the Korean Patent Application No. 10-2022-0040061 with its English translation, 14 pages.

Soppe et al. "Roll to Roll Fabrication of Thin Film Silicon Solar Cells on Nano-Textured Substrates," Journal of Nanoscience and Nanotechnology, 2011, vol. 11, No. 12, pp. 10604-10609.

Paetzold et al. "Nanophotonic front electrodes for perovskite solar cells," Applied Physics Letters, Apr. 27, 2015, vol. 106, article No. 173101 (6 pages).

* cited by examiner

INORGANIC PEROVSKITE QUANTUM DOT-BASED SOLAR CELL INCLUDING NANOSTRUCTURED BACK ELECTRODE AND METHOD OF MANUFACTURING THE SAME

CROSS-REFERENCE TO RELATED APPLICATIONS

This application claims priority under 35 U.S.C. § 119 to Korean Patent Application No. 10-2022-0040061, filed on Mar. 31, 2022 in the Korean Intellectual Property Office, the disclosure of which is incorporated herein by reference in its entirety.

TECHNICAL FIELD

The following disclosure relates to an inorganic perovskite quantum dot-based solar cell including a nanostructured back electrode and a method of manufacturing the same, and in particular, to an inorganic perovskite quantum dot-based solar cell including a nanostructured back electrode and having a significantly improved photoelectric conversion efficiency, and a method of manufacturing the same.

BACKGROUND

Unlike an organic-inorganic hybrid perovskite material, an inorganic $CsPbX_3$ (X=Cl, Br, I) perovskite material has excellent chemical stability and thermal stability because it contains Cs instead of a volatile organic cation.

A cubic phase ($E_g$=1.77 eV) of $CsPbI_3$ perovskite having a band gap ($E_g$) suitable for a solar cell device is thermodynamically unstable at room temperature, and easily transitions to an orthorhombic phase ($E_g$=2.82 eV), which is not suitable for a solar cell device.

However, when $CsPbX_3$ perovskite crystals are synthesized in the form of quantum dots, the contribution of surface energy is increased and the thermodynamic stability of the cubic phase is improved, which may alleviate the phase stability problem.

In order to apply these $CsPbX_3$ perovskite quantum dots to a solar cell device, a distance between the quantum dots needs to be widened, and oleate and oleylammonium cations, which are long hydrocarbon chain ligands that act as electrical resistance in a thin film, need to be removed.

In the related art, a treatment method in which long hydrocarbon chain cationic ligands are removed by substituting oleate with acetate (OAc) ions produced by hydrolysis of methyl acetate (MeOAc) has been developed, and through this method, a $CsPbI_3$ perovskite quantum dot-based solar cell device having a photoelectric conversion efficiency of 10.77% has been manufactured.

However, there is still a problem of a low photoelectric conversion efficiency. In order to solve this problem, in Korean Patent No. 10-2248636, a ligand exchange post-treatment method using a phenylalkylammonium-based ion compound has been introduced, and thus a photoelectric conversion efficiency of about 13% has been achieved.

In general, in order to improve the efficiency of the $CsPbI_3$ perovskite quantum dot-based solar cell, there is a need to increase a photocurrent by increasing a light absorption capacity. A photocurrent may be increased by increasing a thickness of a light absorption layer including perovskite quantum dots, but in the case of the perovskite quantum dot-based solar cell, since a thickness of a light absorption layer is in a trade-off relationship with a diffusion distance of charge carriers, there is a limit on the thickness of the light absorption layer to improve the efficiency of the $CsPbI_3$ perovskite quantum dot-based solar cell.

Therefore, there is a need for a novel technique capable of achieving an excellent photoelectric conversion efficiency compared to the related art by increasing a light absorption capacity even though the light absorption layer included in the perovskite quantum dot-based solar cell has a limited thickness.

RELATED ART DOCUMENT

[Patent Document]
Korean Patent No. 10-2248636

SUMMARY

An embodiment of the present invention is directed to providing an inorganic perovskite quantum dot-based solar cell including a nanostructured back electrode and having a significantly improved photoelectric conversion efficiency by increasing a light absorption capacity by light scattering.

Another embodiment of the present invention is directed to providing a method of manufacturing an inorganic perovskite solar cell capable of easily manufacturing the inorganic perovskite solar cell at room temperature using nanoimprint lithography.

In one general aspect, an inorganic perovskite solar cell includes: an electron transport layer that is disposed on a transparent electrode; a photoactive layer having a flat structure that is disposed on the electron transport layer and includes inorganic perovskite quantum dots; an organic hole transport layer that is disposed on the photoactive layer and includes nanopatterns; and a back electrode that is disposed on the organic hole transport layer.

The nanopatterns may be one-dimensional (1D) grid patterns or two-dimensional (2D) grid patterns.

The 2D grid patterns may have one or more 2D structures selected from a cylindrical shape, a rectangular shape, and a square shape.

The nanopatterns may be 1D grid patterns.

A height of the 1D grid pattern may be 60 nm or less.

An interval between the 1D grid patterns may be 300 to 500 nm.

A thickness of the photoactive layer may be 100 to 400 nm.

The organic hole transport layer may contain spiro-MeOTAD.

A thickness of the back electrode may be 100 to 350 nm.

The back electrode may have a nanostructure derived from the nanopatterns.

The back electrode having the nanostructure may be coupled with light at a wavelength of 580 to 700 nm to generate surface plasmon polaritons.

In another general aspect, a method of manufacturing an inorganic perovskite solar cell includes: a) preparing a dispersion of inorganic perovskite quantum dots; b) forming a photoactive layer by applying the dispersion onto a substrate including an electron transport layer disposed on a transparent electrode; c) spin-coating an organic hole transporting material onto the photoactive layer and then forming an organic hole transport layer including nanopatterns using a nanoimprint lithography process; and d) forming a back electrode on the organic hole transport layer.

The nanoimprint lithography process in the step c) may be performed immediately after the spin coating and before solidification of the organic hole transporting material.

The organic hole transporting material spin-coated in the step c) may be spiro-MeOTAD.

The spin coating in the step c) may be performed for 0.5 to 1.5 seconds.

The photoactive layer formed in the step b) may be formed by b-1) forming a quantum dot layer by applying the dispersion onto a substrate including an electron transport layer disposed on a transparent electrode; and b-2) performing solid-state ligand substitution by bringing the quantum dot layer into contact with a substitution solution that is a mixture of an ester-based solvent and an alkali metal acetate salt a plurality of times.

The steps b-1) and b-2) may be repeated two to six times.

The inorganic perovskite solar cell may be manufactured at room temperature of 15 to 25° C.

Other features and aspects will be apparent from the following detailed description, the drawings, and the claims.

DETAILED DESCRIPTION OF EMBODIMENTS

Figure 1A:
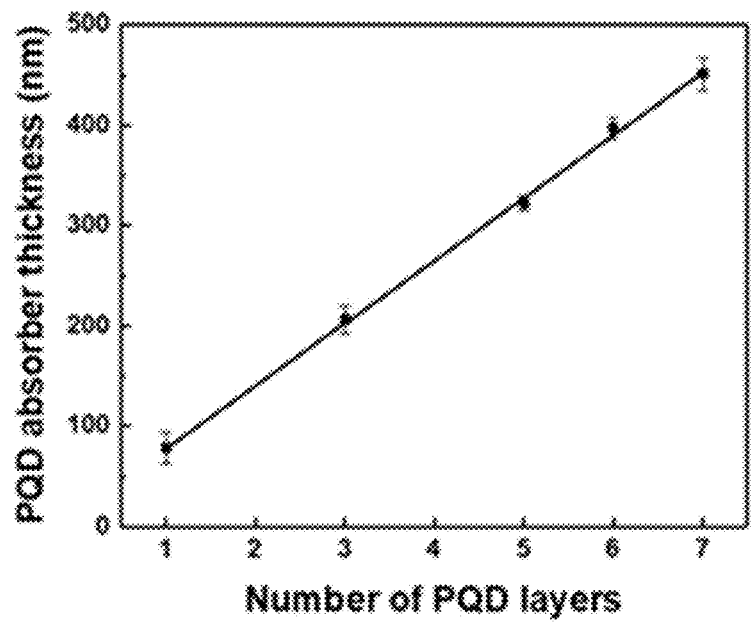
FIGS. 1A to 1E are views illustrating a thickness of a photoactive layer, scanning electron microscope (SEM) images, an absorbance spectrum according to a wavelength, a transmission spectrum according to a wavelength, and efficiency of a perovskite solar cell based on 10 photoelectric conversion efficiency and a short-circuit current density, depending on the number of stacked quantum dot layers, respectively.

Hereinafter, an inorganic perovskite solar cell and a method of manufacturing the same according to an exemplary embodiment of the present invention will be described in detail with reference to the accompanying drawings. The drawings to be provided below are provided by way of example so that the spirit of the present invention can be sufficiently transferred to those skilled in the art.

Therefore, the present invention is not limited to the drawings to be provided below, but may be modified in many different forms. In addition, the drawings provided below may be exaggerated in order to clear the spirit of the present invention.

Technical terms and scientific terms used herein have the general meanings understood by those skilled in the art to which the present invention pertains unless otherwise defined, and a description for the known function and configuration unnecessarily obscuring the gist of the present invention will be omitted in the following description and the accompanying drawings.

In addition, unless the context clearly indicates otherwise, singular forms used in the specification and the scope of the appended claims are intended to include plural forms.

The terms "first", "second", and the like in the present specification and the scope of the appended claims are not used as limiting meanings, but are used to distinguish one component from another component.

The terms "comprise(s)", "include(s)", "have (has)", and the like used in the present specification and the scope of the appended claims indicate the presence of features or components described in the specification, and do not preclude the presence or addition of one or more other features or components, unless specifically limited.

An inorganic perovskite solar cell according to an aspect of the present invention may include: an electron transport layer that is disposed on a transparent electrode; a photoactive layer having a flat structure that is disposed on the electron transport layer and includes inorganic perovskite quantum dots; an organic hole transport layer that is disposed on the photoactive layer and includes nanopatterns; and a back electrode that is disposed on the organic hole transport layer.

Unlike an organic-inorganic hybrid perovskite solar cell, an inorganic perovskite solar cell has excellent chemical stability and thermal stability because it does not contain volatile organic cations. In particular, when perovskite crystals are synthesized in the form of quantum dots, the contribution of surface energy is increased and thermodynamic stability of a cubic phase is improved, which may alleviate a phase stability problem.

In general, in order to improve the efficiency of the solar cell, it is possible to increase a photocurrent through an improvement of a light absorption efficiency by increasing a thickness of a photoactive layer. However, in a case of a perovskite quantum dot-based solar cell, since a diffusion distance of charge carriers is short, recombination between the charge carriers is increased as a thickness of the photoactive layer is increased, and therefore, there is a limit on the thickness of the photoactive layer.

On the other hand, in the case of the inorganic perovskite solar cell according to an exemplary embodiment of the present invention, as the organic hole transport layer that is disposed on the photoactive layer having a flat structure and includes nanopatterns, the photoactive layer including inorganic perovskite quantum dots, and the back electrode that is disposed on the organic hole transport layer are included, unlike the related art, the light absorption efficiency is improved even though a thickness of the photoactive layer is limited, such that an inorganic perovskite solar cell having a significantly improved light absorption efficiency may be provided.

In an exemplary embodiment, the thickness of the photoactive layer may be 100 to 500 nm, preferably 100 to 400 nm, more preferably 200 to 400 nm, and still more preferably 250 to 350 nm.

As described above, in the inorganic perovskite solar cell based on perovskite quantum dots, the thickness of the photoactive layer may be limited due to the short diffusion distance of the charge carriers. Therefore, it is preferable that the thickness of the photoactive layer satisfies the range described above in consideration of the light absorption efficiency and the diffusion distance of the charge carriers.

In this case, the photoactive layer may have a flat structure including inorganic perovskite quantum dots.

As a specific example, the inorganic perovskite quantum dots may include perovskite quantum dots represented by the following Chemical Formula 1:

$$ABX_3.\qquad\text{(Chemical Formula 1)}$$

In Chemical Formula 1, A may be one monovalent metal selected from cesium (Cs), rubidium (Rb), barium (Ba), indium (In), potassium (K), sodium (Na), copper (Cu), and lithium (Li), B may be one divalent metal selected from cobalt (Co), nickel (Ni), iron (Fe), manganese (Mn), chromium (Cr), copper (Cu), tin (Sn), palladium (Pd), ytterbium (Yb), and lead (Pb), and X may be one halogen element selected from F, Cl, Br, and I.

As a specific example, the perovskite quantum dots represented by Chemical Formula 1 may be $CsPbI_3$ perovskite quantum dots.

As an exemplary embodiment, the photoactive layer including inorganic perovskite quantum dots may have a flat structure.

Here, the photoactive layer having a flat structure may be formed by a solid-state ligand substitution reaction using a dispersion in which inorganic perovskite quantum dots are dispersed, which will be described in more detail in terms of a method of manufacturing an inorganic perovskite solar cell to be described below.

As an exemplary embodiment, the photoactive layer may be disposed on the electron transport layer that is disposed on a transparent electrode.

As an example, a material of the transparent electrode is not limited as long as it is a material known in the art, and as a non-limiting example, the transparent electrode may be one or two or more selected from fluorine doped tin oxide (FTO), indium doped tin oxide (ITO), ZnO, a carbon nanotube, graphene, and a composite thereof, but the present invention is not limited thereto.

In an exemplary embodiment, the electron transport layer that is disposed on the transparent electrode may contain an electron conductive inorganic material.

As a specific example, the electron conductive inorganic material may be an electron conductive metal oxide used for electron transport in a common quantum dot-based solar cell. Non-limiting examples of the metal oxide include titanium oxide, zinc oxide, tin oxide, niobium oxide, molybdenum oxide, magnesium oxide, aluminum oxide, vanadium oxide, and a composite oxide thereof, but are not limited thereto.

As a specific example, a thickness of the electron transport layer may be 5 to 300 nm, specifically, 10 to 200 nm, and more specifically, 20 to 100 nm, but is not limited thereto.

As an exemplary embodiment, the inorganic perovskite solar cell may include an organic hole transport layer that is disposed on the photoactive layer described above and includes nanopatterns.

The organic hole transport layer may contain a hole conductive organic material, and specific examples of the hole conductive organic material include 2,2',7,7'-tetrakis(N,N-di-p-methoxyphenylamine)-9,9-spirobifluorene (spiro-OMeTAD), poly(3-hexylthiophene) (P3HT), poly(3,4-ethylenedioxythiophene) (PEDOT), poly(3,4-ethylenedioxythiophene) poly(styrenesulfonate) (PEDOT: PSS), poly (triarylamine) (PTAA), and poly(4-butylphenyl-diphenylamine), but are not limited thereto.

As a preferred example, the organic hole transport layer may contain spiro-OMeTAD as a hole conductive organic material, and a thickness of the organic hole transport layer may be 100 to 500 nm, specifically, 150 to 300 nm, and more specifically, 180 to 250 nm.

Since the organic hole transport layer that is disposed on the photoactive layer has the purpose of hole transport and may include nanopatterns for forming a nanostructure of a back electrode to be described below, it is preferable that the thickness of the organic hole transport layer satisfies the range described above.

In this case, the electron transport layer and the organic hole transport layer may independently be a dense thin film or have a structure in which a dense thin film and a porous film are stacked, but are not limited thereto.

As an exemplary embodiment, the nanopatterns included in the organic hole transport layer may be one-dimensional (1D) grid patterns or two-dimensional (2D) grid patterns.

In this case, the 1D grid patterns may refer to patterns derived from an array in which continuous linear structures having nano-scale widths and heights are repeatedly arranged, and the 2D grid patterns may refer to patterns derived from an array in which 2D structures having nano-scale heights and sizes (length×width or diameter) are repeatedly arranged.

The nanopatterns included in the organic hole transport layer may affect a nanostructure of a back electrode to be described below to induce scattering of incident light incident on the inorganic perovskite solar cell, and as a result, the nanopatterns may contribute to improving the light absorption efficiency.

As a specific example, the 2D grid patterns may have one or more 2D structures selected from a cylindrical shape, a rectangular shape, and a square shape.

As an exemplary embodiment, a height of the 2D grid pattern may be 50 to 400 nm, and specifically, 100 to 200 nm, and an interval between the patterns may be 200 to 1,000 nm, and specifically, 300 to 850 nm.

As a preferred example, the nanopatterns included in the organic hole transport layer may be 1D grid patterns.

As described above, the nanopatterns included in the organic hole transport layer may affect a nanostructure of a back electrode to be described below.

The back electrode having a nanostructure may contribute to improving the light absorption efficiency in the photoactive layer by a light scattering effect while reflecting incident light transmitted through the photoactive layer. However, as can be seen in a method of manufacturing an inorganic perovskite solar cell to be described below, the back electrode is formed on the organic hole transport layer using a deposition process, and in this case, the shapes of the nanopatterns may affect film uniformity of the back electrode or interface characteristics between the back electrode and the organic hole transport layer.

As a specific example, in a case where a back electrode having a nanostructure derived from nanopatterns having complex shapes capable of maximizing light scattering, the light absorption efficiency in the photoactive layer may be improved. However, film uniformity of the back electrode that includes nanopatterns having complex shapes and is formed on the organic hole transport layer or interface characteristics between the back electrode and the organic hole transport layer are inevitably deteriorated.

That is, the back electrode formed by non-conformal coating on the organic hole transport layer may form a void at the interface with the organic hole transport layer, which blocks a movement path of holes, and as a result, the efficiency of the perovskite solar cell is reduced.

As described above, in terms of improving the light absorption efficiency and providing a stable movement path of holes, it is preferable that the nanopatterns included in the organic hole transport layer are 1D grid patterns.

As an exemplary embodiment, a height of the 1D grid pattern may be 200 nm or less, 100 nm or less, 60 nm or less, or 50 nm or less, and may be substantially 10 nm or more and more substantially 20 nm or more.

When the height of the 1D grid pattern exceeds 200 nm, a void is formed at an interface between the back electrode and the organic hole transport layer, which will be described below, to block the movement path of holes, such that the efficiency of the perovskite solar cell may be reduced. When the height of the 1D grid pattern is less than 10 nm, the improvement of the light absorption efficiency may be limited due to a small light scattering effect. Therefore, the height of the 1D grid pattern preferably satisfies the range described above.

As a specific example, an interval between the 1D grid patterns may be 200 to 1,000 nm, specifically, 250 to 850 nm, more specifically, 300 to 500 nm, and still more specifically, 350 to 450 nm.

In an exemplary embodiment, the back electrode that is disposed on the organic hole transport layer may have a nanostructure derived from the nanopatterns described above.

In this case, a thickness of the back electrode may be 50 to 500 nm, specifically, 100 to 350 nm, and more specifically, 100 to 200 nm.

As a non-limiting example, the back electrode may be an electrode formed of gold, silver, platinum, palladium, copper, aluminum, carbon, cobalt sulfide, copper sulfide, nickel oxide, or the like, but is not limited thereto.

As a specific example, a buffer layer may be further included between the organic hole transport layer and the back electrode.

As an example, the buffer layer may contain tungsten oxide or molybdenum oxide. As the buffer layer is further provided between the organic hole transport layer and the back electrode, the movement efficiency of holes may be further improved.

In this case, a thickness of the buffer layer may be 5 to 50 nm, and specifically, 10 to 30 nm, but is not limited thereto.

In an exemplary embodiment, the back electrode having a nanostructure derived from the nanopatterns described above may be coupled with light at a wavelength of 580 to 700 nm to generate surface plasmon polaritons.

Specifically, surface plasmon polaritons may be generated by coupling with light at a wavelength of 580 to 700 nm, and specifically, at a wavelength of 650 to 700 nm, around the nanostructure, and the light absorption efficiency may be further improved by the generated surface plasmon polaritons, such that the efficiency of the perovskite solar cell may be further improved.

According to another aspect of the present invention, there is provided a method of manufacturing the inorganic perovskite solar cell described above.

A method of manufacturing an inorganic perovskite solar cell according to an exemplary embodiment of the present invention may include: a) preparing a dispersion of inorganic perovskite quantum dots; b) forming a photoactive layer by applying the dispersion onto a substrate including an electron transport layer disposed on a transparent electrode; c) spin-coating an organic hole transporting material onto the photoactive layer and then forming an organic hole transport layer including nanopatterns using a nanoimprint lithography process; and d) forming a back electrode on the organic hole transport layer.

In the method of manufacturing an inorganic perovskite solar cell according to an exemplary embodiment of the present invention, after an organic hole transporting material is spin-coated onto the photoactive layer, an organic hole transport layer including nanopatterns formed through a nanoimprint lithography process is formed, and then a back electrode is formed on the organic hole transport layer, such that the light absorption efficiency may be improved through an extremely simple process even though the thickness of the photoactive layer is limited unlike the related art, thereby providing an inorganic perovskite solar cell having a significantly improved photoelectric conversion efficiency.

Hereinafter, the method of manufacturing an inorganic perovskite solar cell will be described in detail for each step.

First, a) a dispersion of inorganic perovskite quantum dots is prepared.

Here, the inorganic perovskite quantum dots are identical to or similar to those described above, and a detailed description thereof will be omitted.

The dispersion of inorganic perovskite quantum dots may be prepared using any method known in the art without limitation.

In a specific example, the inorganic perovskite quantum dot included in the dispersion of inorganic perovskite quantum dots may contain a first non-conductive ligand on a surface of the quantum dot.

In this case, the first ligand is bonded to the inside and/or surface of the perovskite quantum dot in order to passivate the perovskite quantum dots when synthesizing the perovskite quantum dots by a chemical wet method, and may play a role in the perovskite quantum dots from aggregating and immobilizing the perovskite quantum dots to maintain a stable structure.

As a specific example, the first ligand may be oleic acid, oleylamine, trioctylphosphine (TOP), trioctylphosphine oxide (TOPO), octylamine, trioctylamine, hexadecylamine, hexylphosphonic acid (HPA), tetradecylphosphonic acid (TDPA), octylphosphinic acid (OPA), or the like, and may be at least one selected from oleic acid and oleylamine, but is not limited thereto.

As a specific example, a dispersion medium included in the dispersion of inorganic perovskite quantum dots is an organic solvent in which the perovskite quantum dots containing the first ligands are not ionized and decomposed.

As a specific example, the dispersion medium may be a non-polar organic solvent, and as a non-limiting example, the dispersion medium may be one or two or more selected from chloroform, hexene, cyclohexene, 1,4-dioxane, benzene, toluene, hexane, triethylamine, chlorobenzene, ethylamine, diethylether, ethylacetate, acetic acid, 1,2-dichlorobenzene, tert-butyl alcohol, 2-butanol, isopropanol, and methyl ethyl ketone, but the dispersion medium is not limited thereto.

Subsequently, b) a photoactive layer is formed by applying the prepared dispersion onto a substrate including an electron transport layer disposed on a transparent electrode.

Here, the substrate including the electron transport layer disposed on the transparent electrode on which the photoactive layer is formed is identical or similar to that described above, and a detailed description thereof will be omitted.

As an exemplary embodiment, the photoactive layer formed on the substrate may be formed by b-1) forming a quantum dot layer by applying the prepared dispersion onto a substrate including an electron transport layer disposed on a transparent electrode; and b-2) performing solid-state ligand substitution by bringing the quantum dot layer into contact with a substitution solution that is a mixture of an ester-based solvent and a metal acetate salt a plurality of times.

In this case, the steps b-1) and b-2) may be repeated two to six times, preferably three to six times, and more preferably four to six times.

A thickness of the photoactive layer formed on the substrate may be controlled by repeatedly performing the steps b-1) and b-2). As described above, since the thickness of the photoactive layer may be limited according to the effect of reducing the diffusion distance of the charge carriers, it is preferable to perform the steps b-1) and b-2) a plurality of times within the range described above to have a thickness of the photoactive layer within the range described above in consideration n of the light absorption efficiency and the diffusion distance of the charge carriers.

Specifically, the quantum dot layer is formed by applying the prepared dispersion onto the substrate including the electron transport layer disposed on the transparent electrode using a solution coating method, and then the photoactive layer is formed by bringing the quantum dot layer into contact with a substitution solution that is a mixture of an ester-based solvent and a metal acetate salt to substitute the first non-conductive ligand described above with a second conductive ligand having a shorter chain length than the first ligand through a solid-state ligand substitution reaction.

In this case, the second ligand may be derived from the substitution solution that is a mixture of an ester-based solvent and a metal acetate salt.

As a specific example, the substitution solution may be a mixture of an acetate-based solvent and an alkali metal acetate salt, and the second ligand derived from the substitution solution may be an acetate (OAc) ion.

As a specific example, the alkali metal acetate salt may be potassium acetate, sodium acetate, lithium acetate, rubidium acetate, cesium acetate, or a mixture thereof, but is not limited thereto.

As an exemplary embodiment, after the step b-2), a ligand exchange post-treatment process may be further performed.

Specifically, the surface of the photoactive layer may be further stabilized by further performing the ligand exchange post-treatment process.

In a specific example, the ligand exchange post-treatment process may be performed using a phenylalkylammonium-based ionic compound, and the ionic compound may include one or more selected from phenethylammonium, phenylammonium, and benzylammonium ions.

Subsequently, c) an organic hole transporting material is spin-coated onto the formed photoactive layer, and then an organic hole transport layer including nanopatterns is formed using a nanoimprint lithography process.

In this case, the nanoimprint lithography process may be performed immediately after the spin coating and before solidification of the organic hole transporting material.

As a specific example, the nanoimprint lithography process may be performed using a polydimethylsiloxane (PDMS) mold that is nanopatterned with embossing or intaglio.

Here, the nanopatterns are identical or similar to those described above, and detailed descriptions of the shapes of the patterns, the sizes and interval of the patterns will be omitted.

Specifically, in order to transfer the nanopatterns to the organic hole transport layer using the nanopatterned PDMS mold, a spin-coating time for forming the organic hole transport layer may be adjusted according to a glass transition temperature of the organic hole transporting material.

As a specific example, the organic hole transporting material to be spin-coated may be spiro-MeOTAD, and when the organic hole transporting material is spiro-MeOTAD, the spin coating may be performed for 0.5 to 1.5 seconds and preferably 0.8 to 1.3 seconds.

Subsequently, d) a back electrode is formed on the organic hole transport layer including nanopatterns.

In this case, as a method of forming the back electrode, any method known in the art may be used without limitation, and as a specific example, a back electrode may be formed using a thermal evaporation method, but the present invention is not limited thereto.

As an exemplary embodiment, the inorganic perovskite solar cell may be manufactured at room temperature of 15 to 25° C.

As described above, the inorganic perovskite solar cell according to an exemplary embodiment of the present invention may be manufactured by a room temperature process, and as the back electrode having a nanostructure derived from the organic hole transport layer including nanopatterns is formed by a simple nanoimprint lithography process, the light absorption efficiency may be improved even though the photoactive layer has a limited thickness, such that an inorganic perovskite solar cell having a significantly improved photoelectric conversion efficiency may be provided.

Hereinafter, an inorganic perovskite solar cell and a method of manufacturing the same according to an exemplary embodiment of the present invention will be described in more detail with reference to Examples. However, the following Examples are only reference examples for describing the present invention in detail, and the present invention is not limited thereto and may be implemented in various forms.

In addition, unless otherwise defined, all technical terms and scientific terms used herein have the same meanings as commonly understood by those skilled in the art to which the present invention pertains. The terms used for the description herein are only intended to effectively describe a certain Example and are not intended to limit the present invention.

(Preparation Example) Preparation of Colloidal CsPbI$_3$-Perovskite Quantum Dots (PQDs) Dispersion In order to prepare a Cs-oleate precursor, Cs$_2$CO$_3$ (0.407 g), 1-octadecene (20 mL), and oleic acid (1.25 mL) were put into a 250 mL volumetric 3-neck round flask, and gas was removed at a temperature of 120° C. Thereafter, the flask was filled with argon gas while the temperature of the Cs-oleate precursor was lowered to 90° C.

In order to prepare CsPbI$_3$-PQDs, PbI$_2$ (0.5 g) and 1-octadecene (25 mL) were put into a 100 mL volumetric 3-neck round flask, and gas was removed at 115° C. for 30 minutes. After pre-degassed oleic acid (2.5 mL) and oleylamine (2.5 mL) were injected into the flask, the temperature was raised to 180° C. while the flask was filled with argon gas, and the Cs-oleate precursor (2 mL) was rapidly injected into the flask. After 5 seconds, the flask was cooled to 40° C. using ice water.

In order to purify a CsPbI$_3$-POD crude solution, MeOAc (60 mL) as a polar solvent was added to a synthesized CsPbI$_3$-PQD crude solution (30 mL), and centrifugation was performed at 5,000 rpm for 3 minutes.

Thereafter, a supernatant was removed, precipitated CsPbI$_3$-PQDs were dispersed in hexane (10 mL), and MeOAc (14 mL) was added. The supernatant was removed by centrifugation again at 5,000 rpm for 3 minutes. The precipitated CsPbI$_3$-PQDs were re-dispersed in hexane (30 mL) and centrifugation was performed at 5,000 rpm for 3 minutes.

CsPbI$_3$-PQDs dispersed in hexane were prepared at a concentration of 75 mg/mL by evaporating hexane under vacuum and dispersing dried CsPbI$_3$-PQDs in octane.

Example 1

A patterned-FTO substrate was sonicated sequentially in detergent water, deionized water, acetone, and isopropyl alcohol for 10 minutes each. The sonicated FTO substrate was prepared by UV ozone treatment to modify a surface thereof to be hydrophobic.

After a c-TiO$_2$ precursor solution (0.15 M, Sharechem) was spin-coated at 3,000 rpm for 30 seconds onto the prepared FTO substrate, the FTO substrate was heat-treated at 500° C. for 1 hour, cooled to room temperature, immersed in a 120 mM TiCl$_4$ solution, heat-treated at 70° C. for 1 hour, washed with deionized water, and then heat-treated again at 500° C. for 1 hour, thereby obtaining an FTO substrate coated with c-TiO$_2$ (hereinafter, referred to as a c-TiO$_2$/FTO substrate) as an electron transport layer.

Thereafter, the prepared CsPbI$_3$-PQDs dispersion was applied onto the c-TiO$_2$/FTO substrate, and spin coating was performed at 1,000 rpm for 20 seconds and 2,000 rpm for 5 seconds, thereby forming a quantum dot layer. After the c-TiO$_2$/FTO substrate on which the quantum dot layer was formed was immersed in a substitution solution prepared by diluting sodium acetate (NaOAc, Sigma Aldrich) in methyl acetate (MeOAc) for 3 seconds, the c-TiO$_2$/FTO spin-dried and then washed with MeOAc. At this time, the concentration of sodium acetate in the substitution solution was 1 mg/mL. This process was repeated three to six times to form a solid-state ligand-substituted CsPbI$_3$-PQDs layer having a thickness of about 300 nm on the electron transport layer. Then, the solid-state ligand-substituted CsPbI$_3$-PQDs layer was immersed in a solution (1 mg/mL) obtained by dissolving phenethylammonium iodide (PEAI, Alfa Aesar) in an ethyl acetate (EtOAc) solvent for 10 seconds, and then washing with MeOAc and spin drying were performed, thereby forming a photoactive layer.

Thereafter, a spiro-MeOTAD solution prepared at a concentration of 520 mg/mL by dissolving a solution of 72.3 mg of spiro-MeOTAD (≥99.5%, Lumtec), 1 mL of chlorobenzene, 28.8 μL of 2-pentylpyridine, and UL 17.5 of lithium bis(trifluoromethylsulfonyl)imide (Li-TFSI, Alfa Aesar) in acetonitrile was applied onto the photoactive layer, and the spiro-MeOTAD solution was spin-coated at 4,000 rpm for 1.2 seconds to form a hole transport layer on the photoactive layer, and then a nanoimprint lithography process in which a pressure was applied with a nanopatterned polydimethylsiloxane (PDMS) mold for 2 minutes was performed immediately before a hole transporting material was solidified, thereby forming an organic hole transport layer including nanopatterns. At this time, the nanopatterns formed on the organic hole transport layer were cylindrical two-dimensional grid patterns, a height of the pattern was 300 nm, an interval between the patterns was 500 nm, and the nanopatterns were referred to as P1.

Finally, a 15 nm-thick MoO$_x$ buffer layer and a silver (Ag) electrode were sequentially deposited on the formed organic hole transport layer using a thermal evaporation method to form a back electrode having a nanostructure derived from the nanopatterns included in the organic hole transport layer, thereby manufacturing a quantum dot-based inorganic perovskite solar cell.

Example 2

A process was performed in the same manner as that of Example 1, except that the spiro-MeOTAD solution was applied onto the photoactive layer, spin coating was performed at 4,000 rpm for 0.5 seconds, and then the nanoimprint lithography process was performed.

Example 3

A process was performed in the same manner as that of Example 1, except that the spiro-MeOTAD solution was applied onto the photoactive layer, spin coating was performed at 4,000 rpm for 3 seconds, and then the nanoimprint lithography process was performed.

Example 4

A process was performed in the same manner as that of Example 1, except that nanopatterns having a one-dimensional grid pattern shape having a pattern height of 200 nm and an interval between the patterns of 830 nm (hereinafter, referred to as P2) were formed on the organic hole transport layer by performing the nanoimprint lithography process.

Example 5

A process was performed in the same manner as that of Example 1, except that nanopatterns having a one-dimensional grid pattern shape having a pattern height of 80 nm and an interval between the patterns of 560 nm (hereinafter, referred to as P3) were formed on the organic hole transport layer by performing the nanoimprint lithography process.

Example 6

A process was performed in the same manner as that of Example 1, except that nanopatterns having a one-dimensional grid pattern shape having a pattern height of 40 nm and an interval between the patterns of 420 nm (hereinafter, referred to as P4) were formed on the organic hole transport layer by performing the nanoimprint lithography process.

Example 7

A process was performed in the same manner as that of Example 6, except that the spiro-MeOTAD solution was applied onto the photoactive layer, spin coating was performed at 4,000 rpm for 0.5 seconds, and then the nanoimprint lithography process was performed.

Example 8

A process was performed in the same manner as that of Example 6, except that the spiro-MeOTAD solution was applied onto the photoactive layer, spin coating was performed at 4,000 rpm for 2.0 seconds, and then the nanoimprint lithography process was performed.

Example 9

A process was performed in the same manner as that of Example 6, except that the spiro-MeOTAD solution was applied onto the photoactive layer, spin coating was performed at 4,000 rpm for 3.0 seconds, and then the nanoimprint lithography process was performed.

Comparative Example 1

A process was performed in the same manner as that of Example 1, except that the nanoimprint lithography process was not performed and an organic hole transport layer having a flat shape was formed.

Comparative Example 2

A process was performed in the same manner as that of Comparative Example 1, except that the spiro-MeOTAD solution was applied onto the photoactive layer, and then spin coating was performed at 4,000 rpm for 30 seconds to form an organic hole transport layer having a flat shape.

(Experimental Example 1) Comparison of Performance Between Inorganic Perovskite Solar Cells According to Thickness of Photoactive Layer The performances of the inorganic perovskite solar cells according to a thickness the photoactive layer including inorganic perovskite quantum dots were compared and analyzed.

The thickness of the photoactive layer was controlled by the number of quantum dot layers formed by repeating a layer by layer (LBL) process of performing a plurality of solid-state ligand substitution reactions one to seven times using the colloidal $CsPbI_3$-PQDs dispersion prepared according to the preparation example.

FIGS. 1A to 1E are views illustrating a thickness of a photoactive layer, scanning electron microscope (SEM) images, an absorbance spectrum according to a wavelength, a transmission spectrum according to a wavelength, and efficiency of a perovskite solar cell based on a photoelectric conversion efficiency and a short-circuit current density, depending on the number of stacked quantum dot layers, respectively.

At this time, the absorbance and transmission spectra according to the wavelength were measured using UV-vis absorption spectroscopy, and the efficiency of the perovskite solar cell was measured using a solar simulator (Newport Oriel Sol 3A solar simulator) in a state of applying light with an intensity of 100 mW cm$^{-2}$ to which an AM 1.5 G optical filter was applied.

Figure 1B:
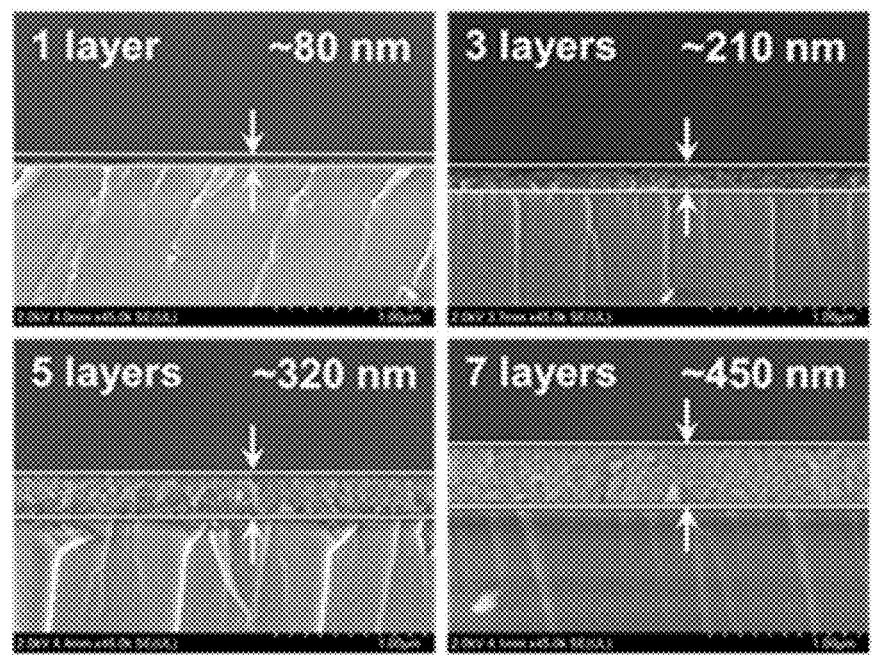
Figure 1C:
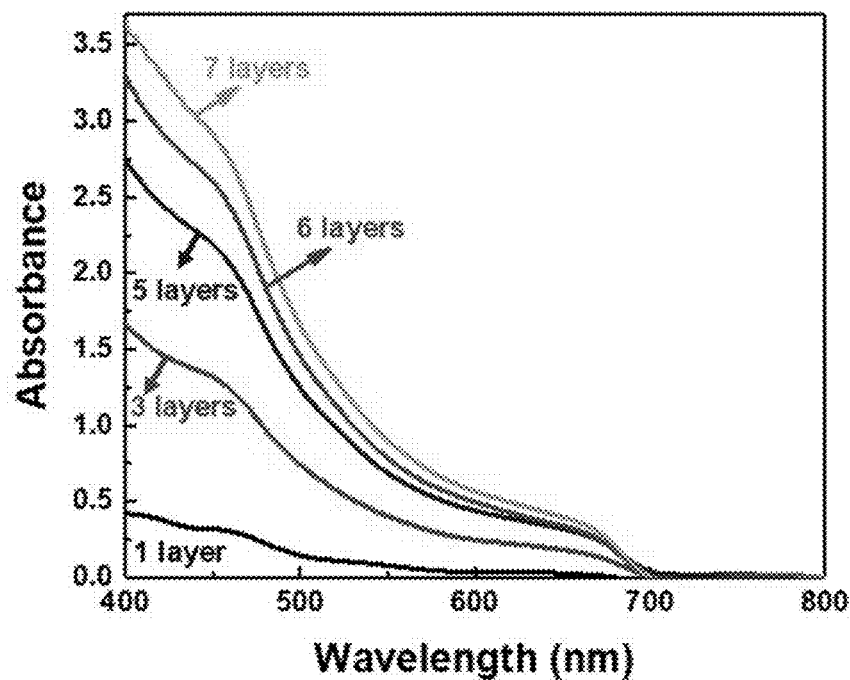

As illustrated in FIGS. 1A to 1C, it was observed that the thickness of the photoactive layer was increased from about 80 nm to 450 nm as the number of stacked quantum dot layers constituting the photoactive layer was increased from 1 to 7, and it was confirmed that the light absorption efficiency at a wavelength of 400 to 700 nm was increased as the thickness of the photoactive layer was increased.

Figure 1D:
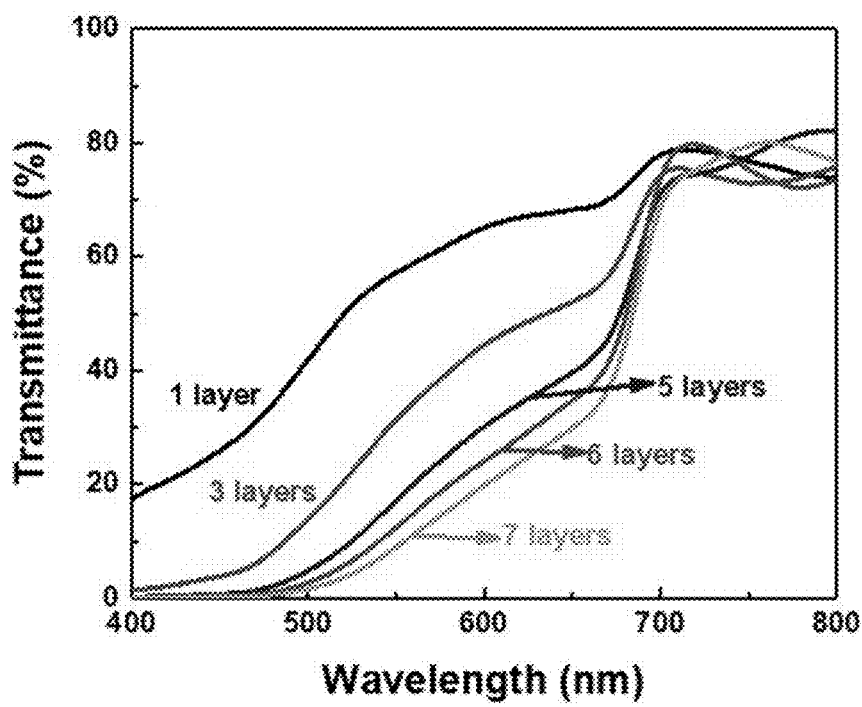
Figure 1E:
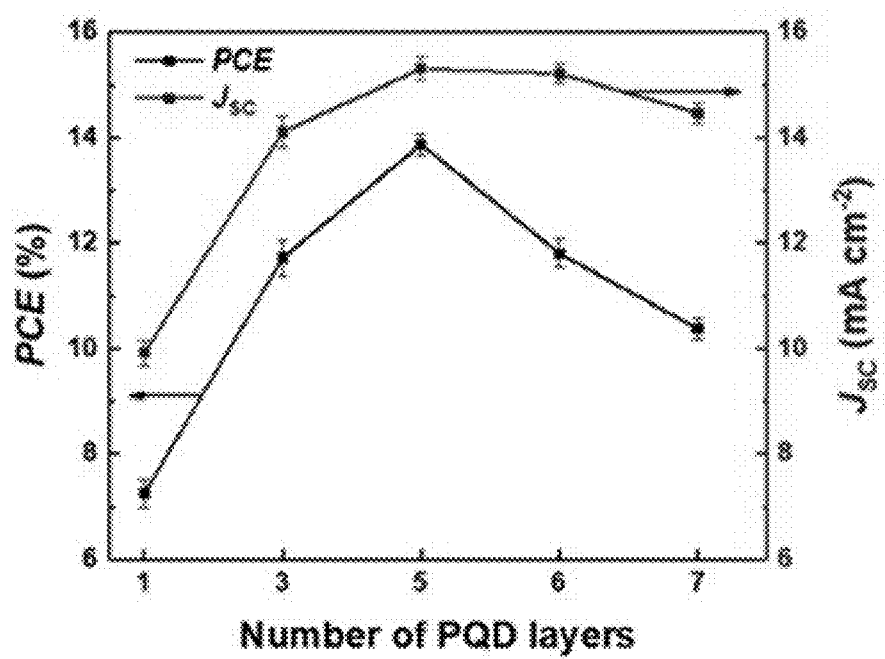

However, referring to FIG. 1E, it could be appreciated that when the number of stacked quantum dot layers was 1 to 5, the efficiency of the perovskite solar cell based on the photoelectric conversion efficiency and the short-circuit current density was improved, but when the number of stacked quantum dot layers was 6 or more, the efficiency the perovskite solar cell was rather reduced. This is because the efficiency may be improved by increasing the light absorption capacity as the thickness of the photoactive layer is increased to a certain thickness, but when the thickness of the photoactive layer exceeds a critical value, recombination of photoexcited charge carriers occurs due to a short diffusion distance of the charge carriers, and thus the efficiency of the solar cell is reduced.

In addition, referring to FIG. 1D, it was confirmed that a considerable amount of light at a wavelength of 500 to 700 nm was still transmitted even when the thickness of the photoactive layer was relatively large, and through this, a method of using the transmitted light for photocurrent production was considered.

(Experimental Example 2) Confirmation of Formation of Nanopatterns Through Nanoimprint Lithography Process It was confirmed whether nanopatterns were formed on the organic hole transport layer the nanoimprint lithography process performed after forming the organic hole transport layer according to the spin process time.

Figure 2A:
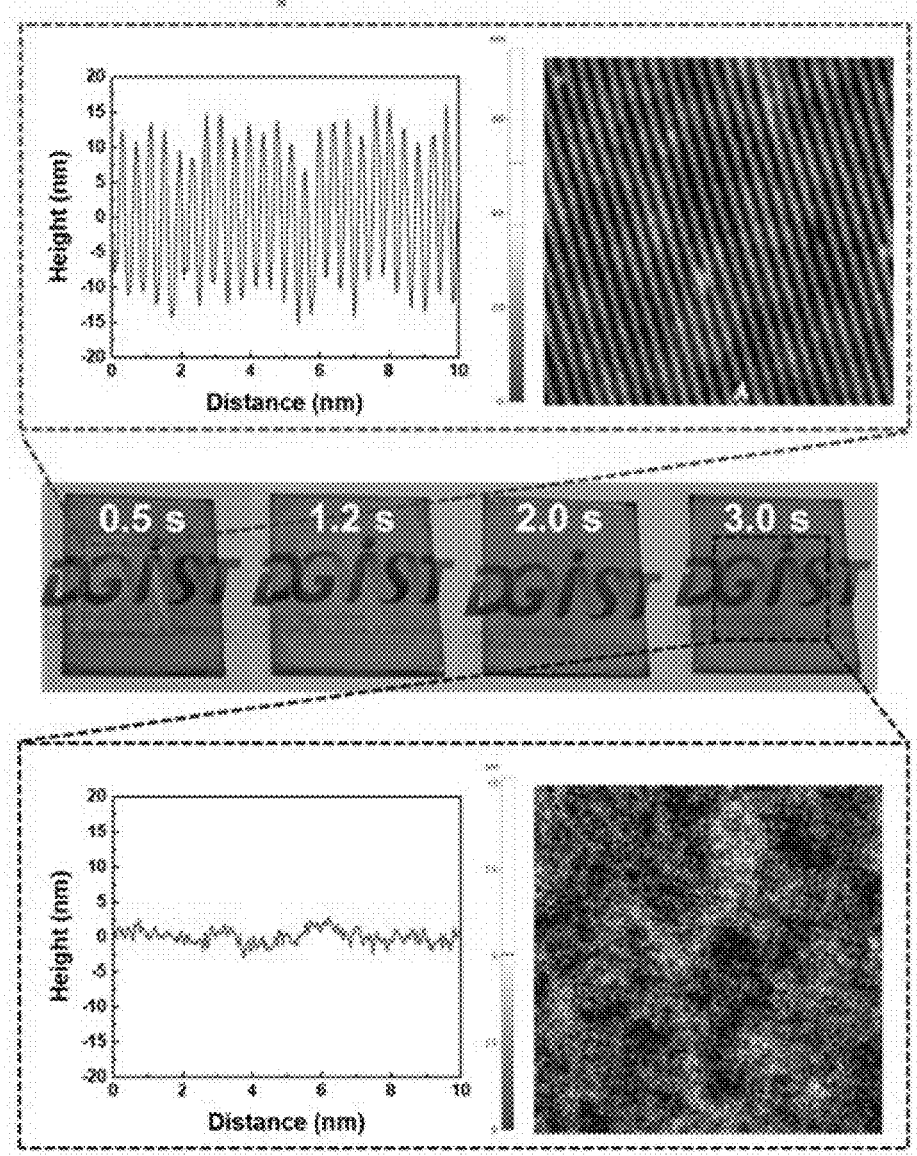
FIGS. 2A and 2B are views illustrating atomic force microscope (AFM) images and line profiles obtained by applying a spiro-MeOTAD solution and a poly(3-hexylthiophene) (P3HT) solution and then measuring P4 patterns formed by a nanoimprint lithography process using a PDMS mold according to spin-coating times (0.5 seconds, 1.2 seconds, 2.0 seconds, and 3.0 seconds), respectively.
Figure 2B:
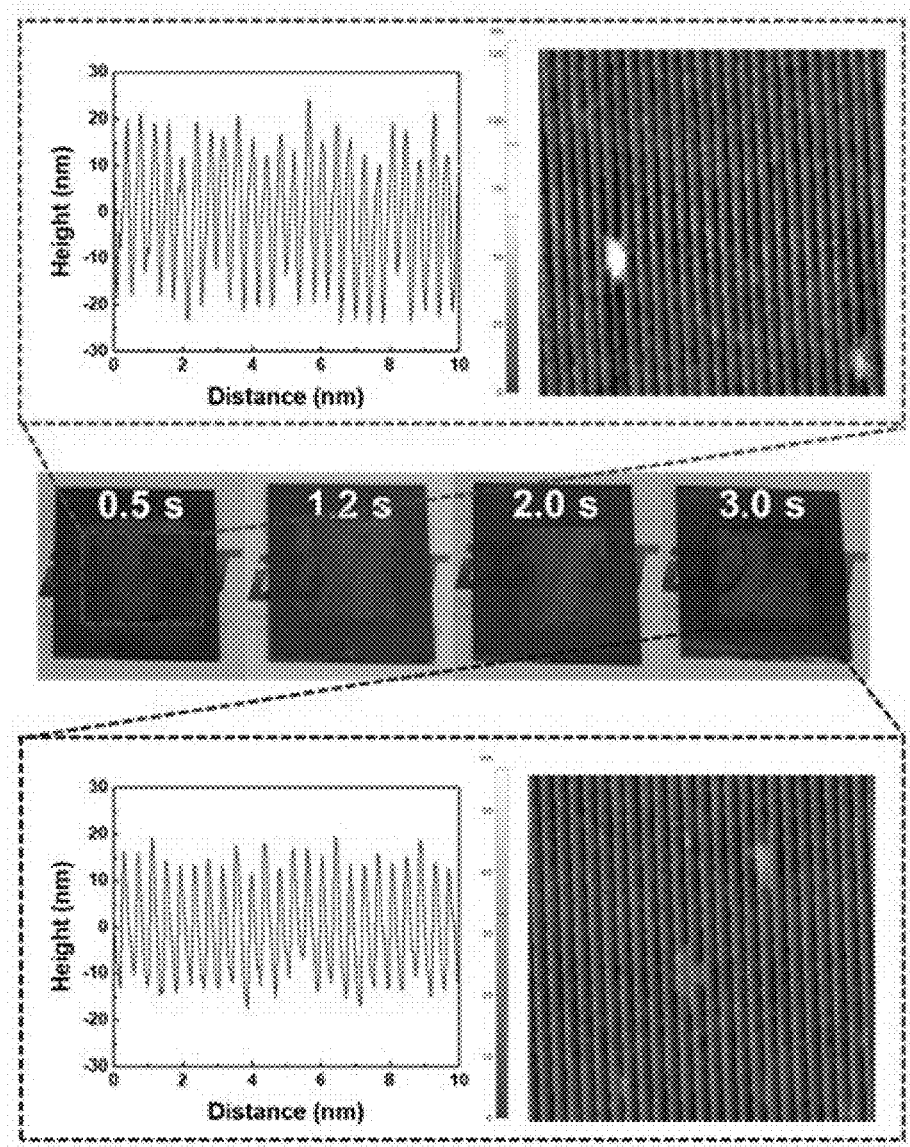

FIGS. 2A and 2B are views illustrating atomic force microscope (AFM) images and line profiles obtained by applying a spiro-MeOTAD solution and a poly(3-hexylthiophene) (P3HT) solution and then measuring P4 patterns formed by a nanoimprint lithography process using a PDMS mold according to spin-coating times (0.5 seconds, 1.2 seconds, 2.0 seconds, and 3.0 seconds), respectively.

As illustrated in FIG. 2A, it was observed that the P4 patterns were formed only in the cases where the spin-coating times were 0.5 seconds and 1.2 seconds after the spiro-MeOTAD solution was applied, and on the other hand, it was observed that in the case where the P3HT solution was applied, the P4 patterns were formed at all the spin-coating times (FIG. 2B). This is because spiro-MeOTAD having a glass transition temperature of about 125° C. is solidified significantly quickly at room temperature compared to P3HT (a glass transition temperature of about 9° C.). Therefore, it can be appreciated that in order to form nanopatterns on the organic hole transport layer, a nanoimprint lithography process should be performed after coating the organic hole transporting material and before solidification of the organic hole transporting material.

In addition, in forming nanopatterns on the organic hole transport layer, in order to confirm the effect of the shapes of the patterns on the spin-coating time, the spiro-MeOTAD solution was applied, and then a nanoimprint lithography process was performed using a PDMS mold having different shapes of patterns according to spin-coating times (0.5 seconds and 3.0 seconds).

Figure 3A:
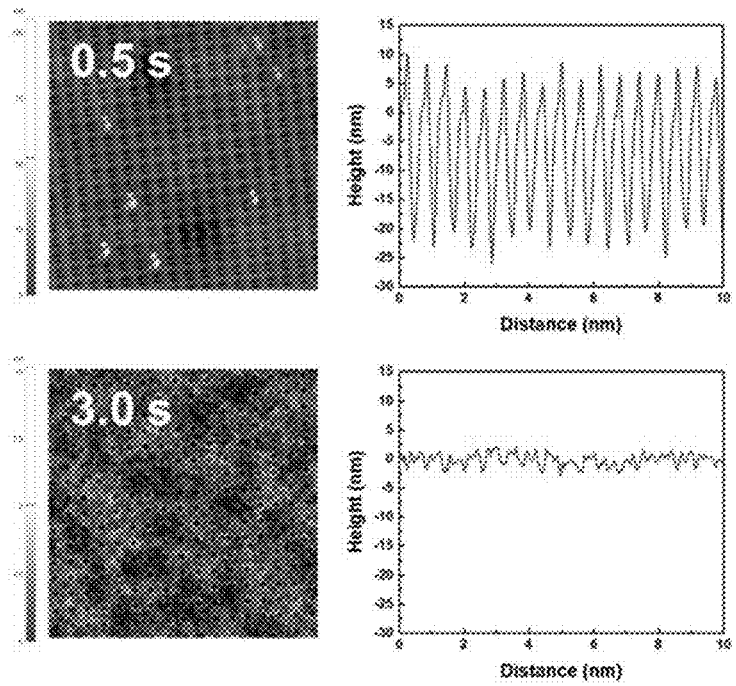
FIGS. 3A to 3C are views illustrating atomic force microscope (AFM) images and line profiles obtained by measuring P1, P2, and P3 patterns formed by a nanoimprint lithography process using a PDMS mold, respectively.
Figure 3B:
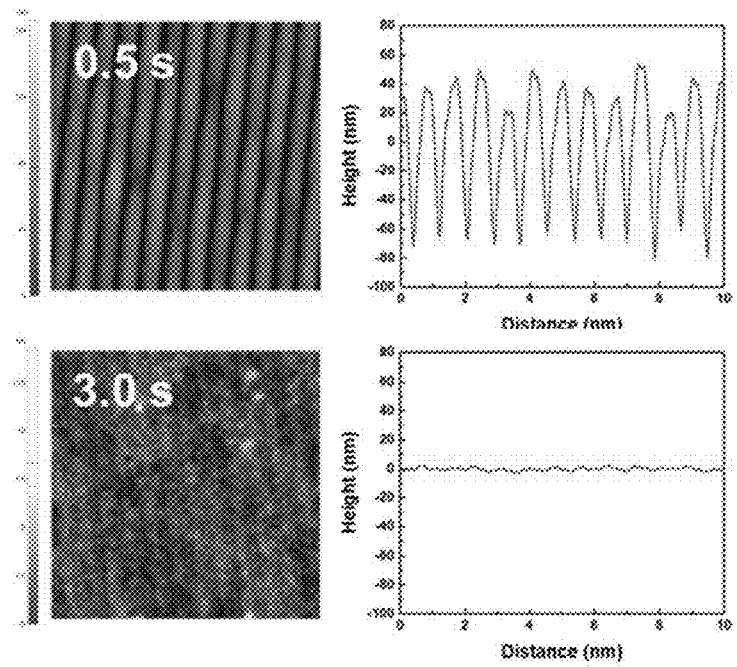
Figure 3C:
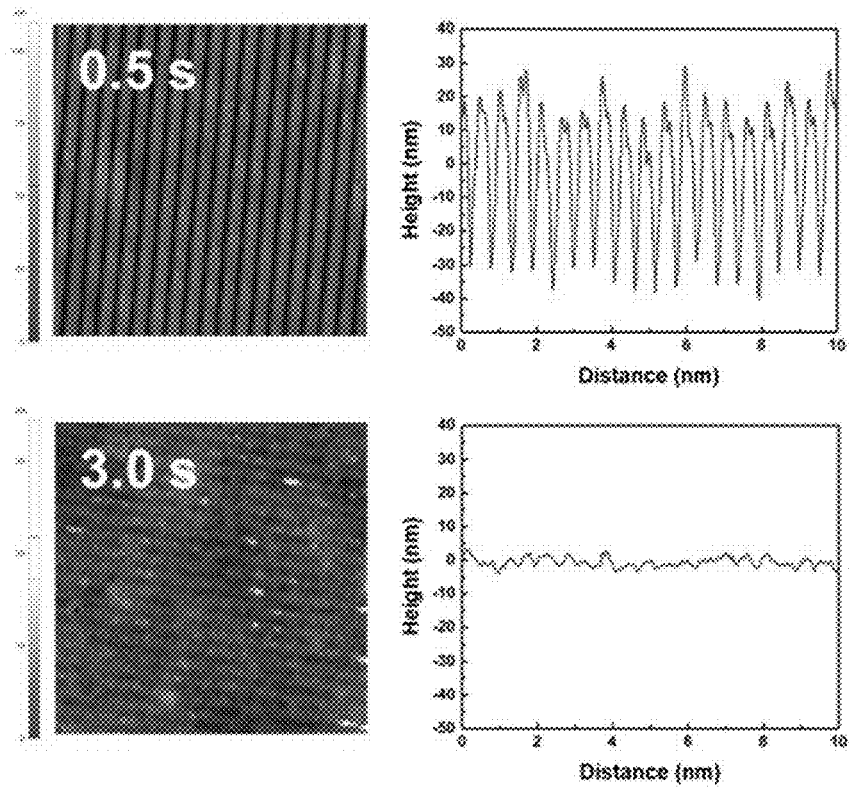

FIGS. 3A to 3C are views illustrating atomic force microscope (AFM) images and line profiles obtained by measuring P1, P2, and P3 patterns formed by a nanoimprint lithography process using a PDMS mold, respectively.

As illustrated in FIGS. 3A to 3C, it was reconfirmed that the different shapes of patterns were formed according to the spin-coating time similar to that in the P4 patterns described above.

In addition, a correlation between the spin-coating time of the spiro-MeOTAD solution and the efficiency of the perovskite solar cell was investigated.

Figure 4A:
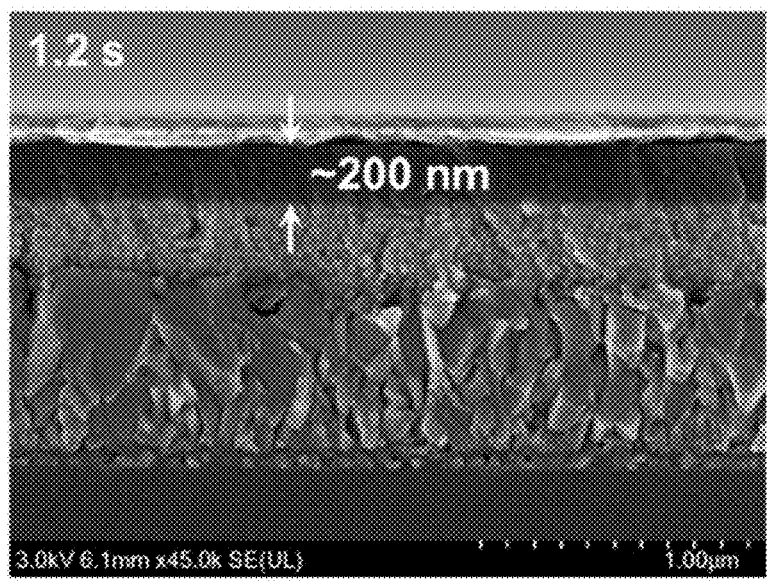
FIGS. 4A and 4B are views illustrating SEM images of a perovskite solar cell (Comparative Example 1) including an organic hole transport layer formed by spin-coating a spiro-MeOTAD solution onto a photoactive layer for 1.2 seconds and a perovskite solar cell (Comparative Example 2) including an organic hole transport layer formed by spin-coating a spiro-MeOTAD solution onto a photoactive layer for 30 seconds, respectively.
Figure 4B:
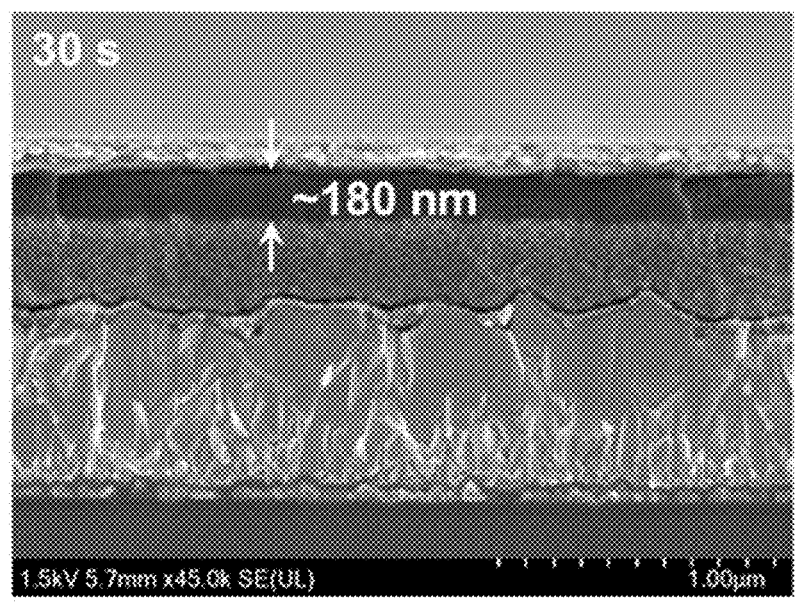
Figure 4C:
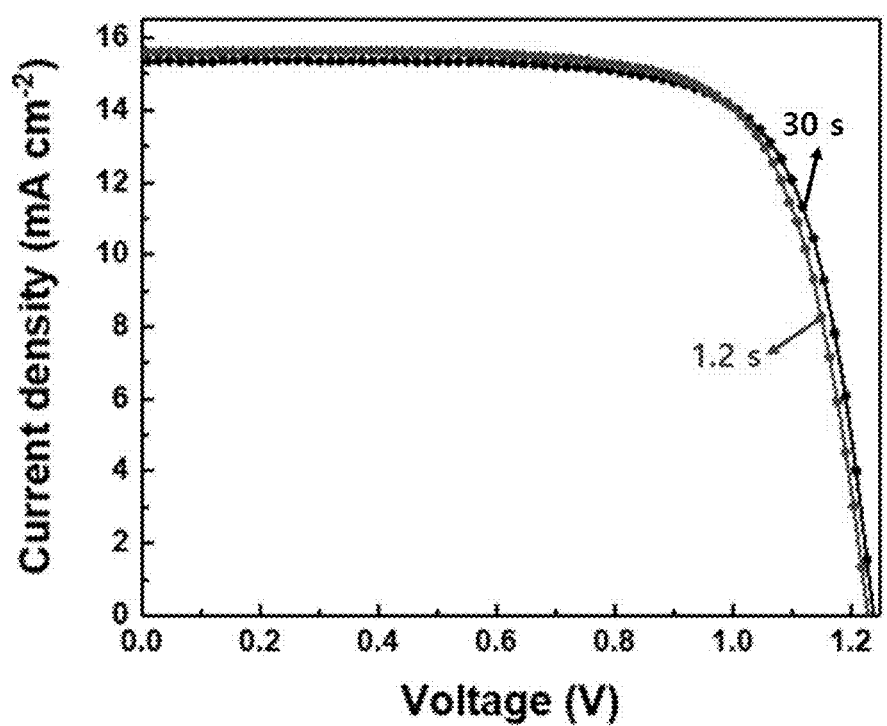
FIG. 4C is a view illustrating current density-voltage curves of Comparative Examples 1 and 2.

FIGS. 4A and 4B are views illustrating SEM images of a perovskite solar cell (Comparative Example 1) including an organic hole transport layer formed by spin-coating a spiro-MeOTAD solution onto a photoactive layer for 30 seconds and a perovskite solar cell (Comparative Example 2) including an organic hole transport layer formed by spin-coating a spiro-MeOTAD solution onto a photoactive layer for 1.2 seconds, respectively, and FIG. 4C is a view illustrating current density-voltage curves of Comparative Examples 1 and 2.

The open-circuit voltage (Voc), the short-circuit current density (Jsc), the fill factor the (FF), and photoelectric conversion efficiency (PCE) of each of Comparative Examples 1 and 2 calculated from the current density-voltage curves are summarized in Table 1.

TABLE 1

| Spin-coating time (s) | Voc (V) | Jsc (mA cm$^{-2}$) | FF (%) | PCE (%) |
|---|---|---|---|---|
| 30 | 1.24 | 15.3 | 74.3 | 14.1 |
| 1.2 | 1.23 | 15.6 | 73.3 | 14.1 |

It was confirmed that, as illustrated in FIGS. 4A and 4B, the thicknesses of the organic hole transport layers included in the perovskite solar cells of Comparative Examples 1 and 2 were 180 nm and 200 nm, respectively, which were slightly different, but as can be seen in FIG. 4C and Table 1, the efficiencies of the perovskite solar cells were equivalent. That is, it can be appreciated that the spin-coating time for forming the organic hole transport layer does not affect the efficiency of the perovskite solar cell.

(Experimental Example 3) Evaluation of Performance of Perovskite Solar Cell According to Shapes of Nanopatterns Formed on Organic Hole Transport Layer In order to compare and analyze the performances of the perovskite solar cells according to the shapes of the nanopatterns formed on the organic hole transport layer, the efficiencies of the perovskite solar cells (Examples 1, 4, 5, and 6) including the organic hole transport layers on which P1, P2, P3, and P4 patterns were formed, respectively, were compared with the efficiency of the perovskite solar cell of Comparative Example 1 including the organic hole transport layer having a flat structure in which nanopatterns were not included.

Figure 5A:
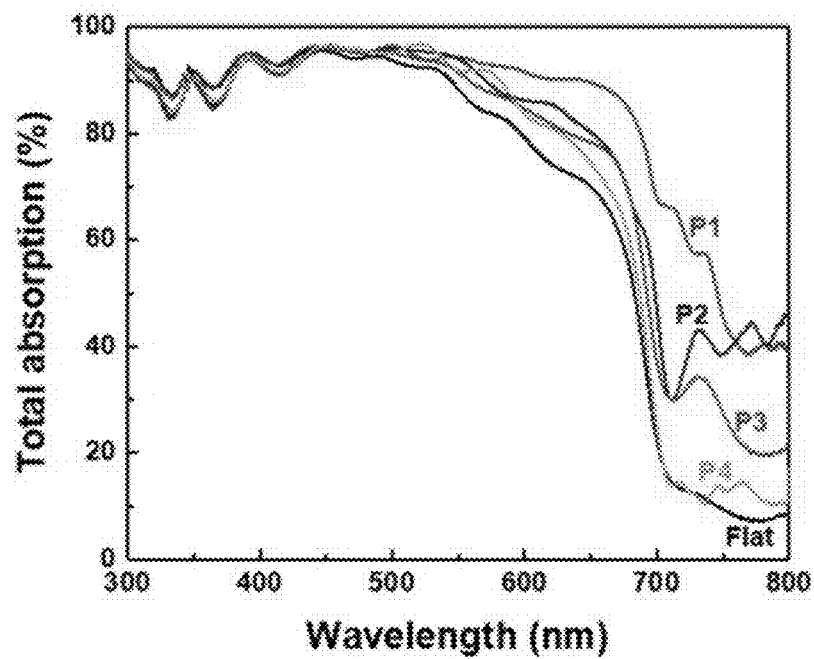
FIGS. 5A to 5C are views illustrating absorbance spectra according to a wavelength, current density curves according to a voltage, and external quantum efficiency (EQE) spectra of Comparative Example 1 (Flat), Example 1 (P1 patterns), Example 4 (P2 patterns), Example 5 (P3 patterns), and Example 6 (P4 patterns), respectively.
Figure 5B:
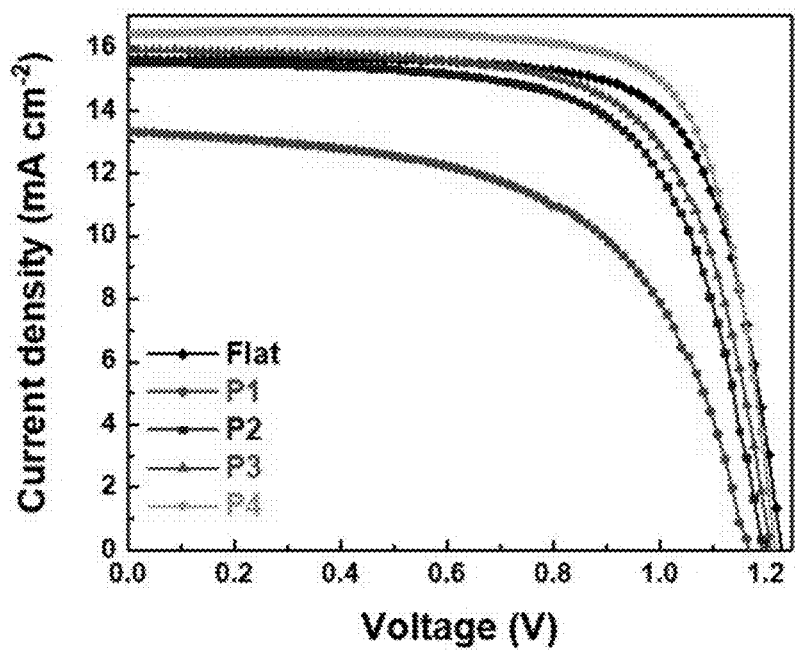
Figure 5C:
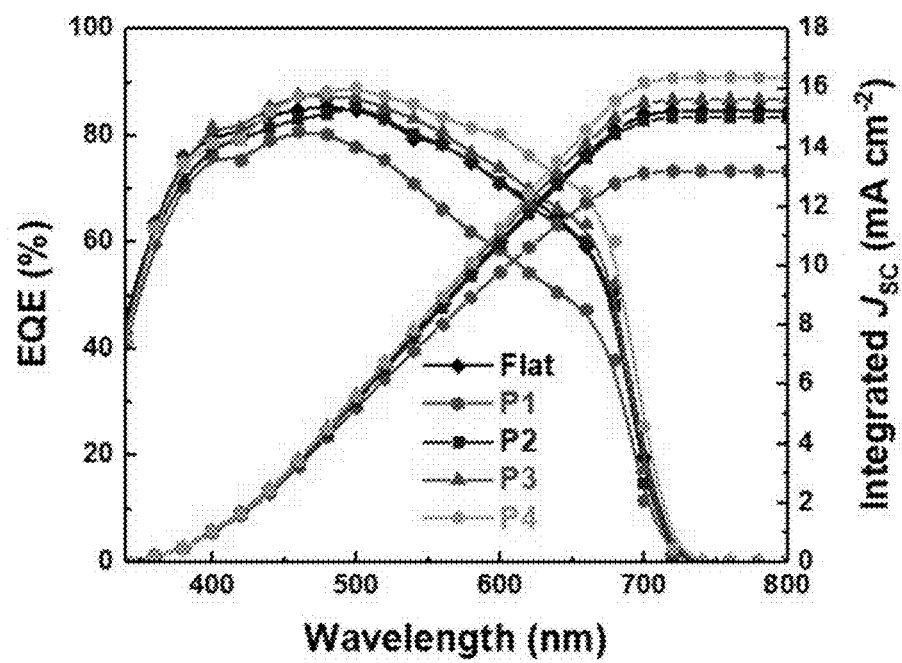

FIGS. 5A to 5C are views illustrating absorbance spectra according to a wavelength, current density curves according to a voltage, and external quantum efficiency (EQE) spectra of Comparative Example 1 (Flat), Example 1 (P1 patterns), Example 4 (P2 patterns), Example 5 (P3 patterns), and Example 6 (P4 patterns), respectively.

As illustrated in FIG. 5A, it could be appreciated that in the case where the nanopatterns were included in the organic hole transport layer, the light absorption efficiency was improved compared to Comparative Example 1 in which the organic hole transport layer having a flat shape was included. In particular, it was observed that the light absorption efficiency was further improved as the height of the pattern was increased at a wavelength of about 550 nm or more, and in the case of the P2 patterns having a relatively large inter-distance, it was observed that the light absorption efficiency was increased again at a wavelength of 700 nm or more, unlike the case including other nanopatterns. It is determined that such an improvement of the light absorption efficiency is due to the effect of plasmon resonance coupling and back-scattered light derived from the shapes of the nanopatterns.

However, referring to the current density curve according to the voltage in FIG. 5B, unlike the improvement of the light absorption efficiency, in the cases of Examples 1, 4, and 5 including the P1, P2, and P3 patterns, it was observed that the efficiency of the perovskite solar cell was inferior to that in Comparative Example 1.

The open-circuit voltage (Voc), the short-circuit current density (Jsc), the fill factor (FF), and the photoelectric conversion efficiency (PCE) of each of Comparative Example 1 (Flat), Example 1 (P1 patterns), Example 4 (P2 patterns), Example 5 (P3 patterns), and Example 6 (P4 patterns) calculated from the current density-voltage curves are summarized in Table 2.

TABLE 2

| Device (depth/pitch) | Voc (V) | Jsc (mA cm$^{-2}$) | FF (%) | PCE (%) |
|---|---|---|---|---|
| Flat control | 1.23 | 15.6 | 73.3 | 14.1 |
| P1 (300 nm/500 nm) | 1.17 | 13.3 | 57.8 | 9.0 |
| P2 (200 nm/830 nm) | 1.19 | 15.5 | 67.4 | 12.5 |
| P3 (80 nm/560 nm) | 1.21 | 15.9 | 68.3 | 13.1 |
| P4 (40 nm/420 nm) | 1.22 | 16.5 | 74.7 | 15.0 |

In particular, in the case of Example 5 including the P3 patterns, it could be appreciated that the short-circuit current density was higher than that in Comparative Example 1, but the open-circuit voltage and the fill factor were lower than those in Comparative Example 1, as shown in the external quantum efficiency spectrum results of FIG. 5C.

In contrast, it was confirmed that the perovskite solar cell of Example 6 including the P4 patterns exhibited about 6.4% improved photoelectric conversion efficiency compared to Comparative Example 1. From this, only in Example 6 including the P4 patterns, it was confirmed that even though the light absorption efficiency of the perovskite solar cell including the nanopatterns was increased, the photoelectric conversion efficiency was improved regardless of the shapes of the patterns.

In order to determine the cause of these results, SEM images of the cross sections of Example 1 (P1 patterns), Example 4 (P2 patterns), Example 5 (P3 patterns), and Example 6 (P4 patterns) were additionally analyzed.

Figure 6:
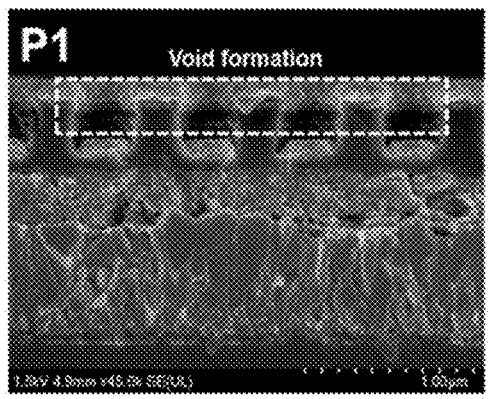
FIG. 6 is a view illustrating cross-sectional SEM images of perovskite solar cells including organic hole transport layers in which P1, P2, P3, and P4 patterns are formed, respectively.
Figure 6:
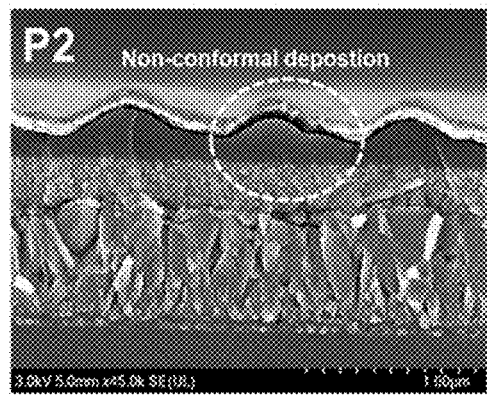
Figure 6:
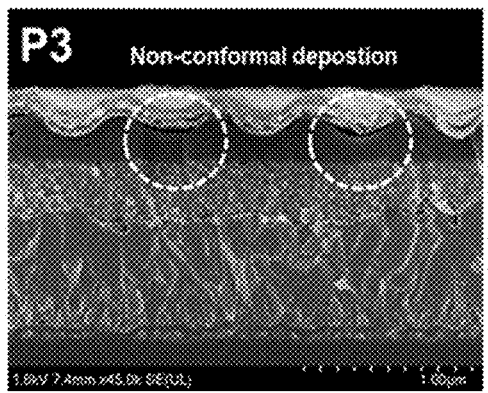
Figure 6:
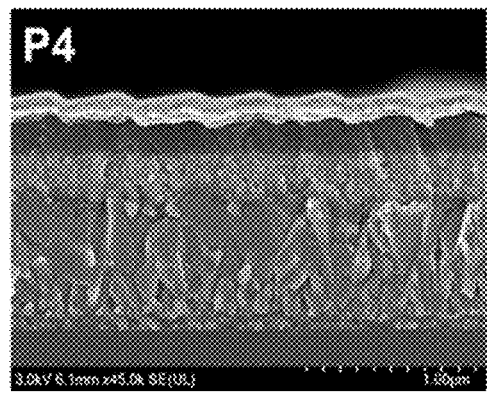

FIG. 6 is a view illustrating cross-sectional SEM images of perovskite solar cells including organic hole transport layers in which P1, P2, P3, and P4 patterns are formed, respectively.

As can be seen in FIG. 6, unlike the case of including the P4 patterns, in the case where the P1, P2, and P3 patterns were included in the organic hole transport layer, it was observed that the conformity of the back electrode having a nanostructure derived from the nanopatterns on the organic hole transport layer was poor.

This is because the back electrode formed by non-conformal coating forms a void at the interface with the organic hole transport layer, and incomplete electrical contact is caused, thereby reducing the efficiency of the perovskite solar cell.

Additionally, a finite-difference time-domain (FDTD) simulation was performed on the flat structure and the P4 patterns in order to more closely analyze the P4 patterns formed on the organic hole transport layer. At this time, a model structure (unit structure) of the perovskite solar cell was designed with reference to the obtained SEM images, and the unit structure was irradiated with a linearly polarized plane wave of a plane wave at a wavelength of 350 to 1,100 nm.

Figure 7A:
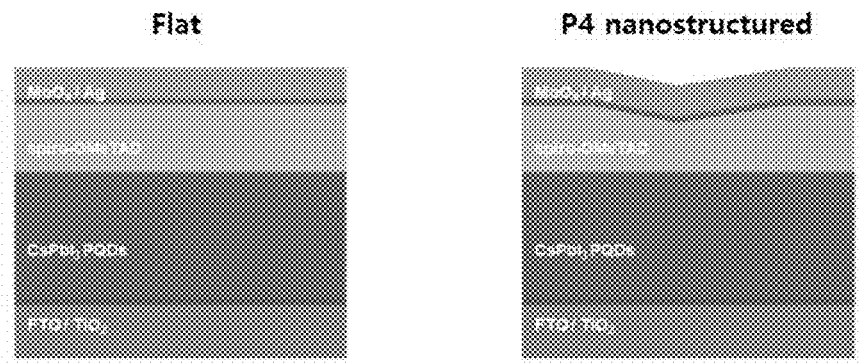
FIG. 7A illustrates cross-sectional schematic views of perovskite solar cells having a flat structure and a P4 structure, respectively.
Figure 7B:
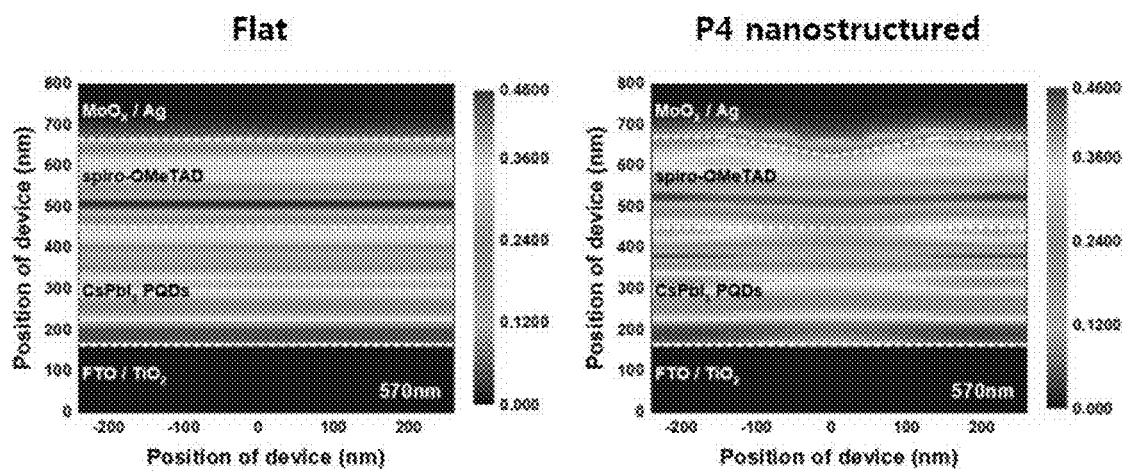
FIGS. 7B and 7C are views illustrating results of an electric field distribution at a wavelength of 570 nm and results of an electric field distribution at a wavelength of 675 nm in the perovskite solar cells having a flat structure and a P4 structure, respectively.
Figure 7C:
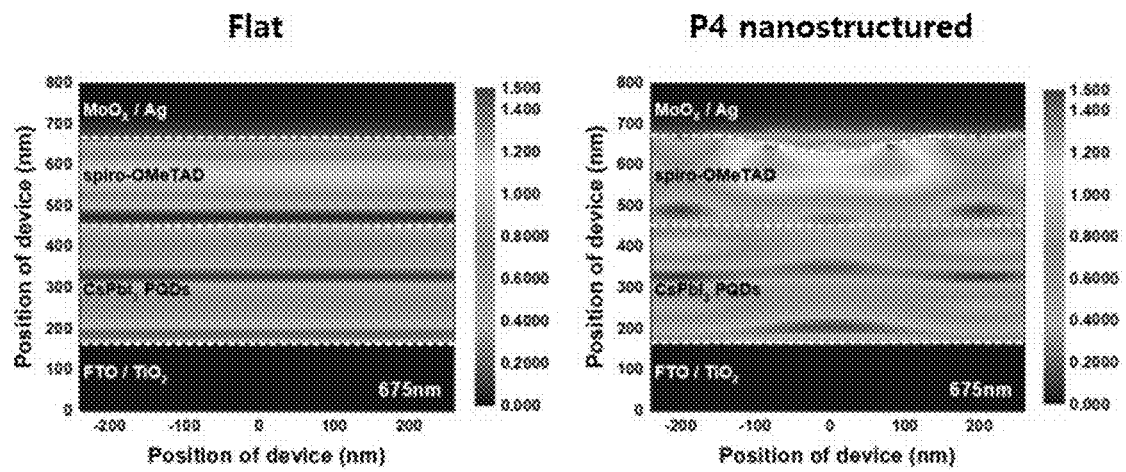

FIG. 7A illustrates cross-sectional schematic views of perovskite solar cells having a flat structure and a P4 structure, respectively, and FIGS. 7B and 7C are views illustrating results of an electric field distribution at a wavelength of 570 nm and results of an electric field distribution at a wavelength of 675 nm in the perovskite solar cells having a flat structure and a P4 structure, respectively.

Referring to FIGS. 7B and 7C, it could be appreciated that in the case of the flat structure, the electric field existed in the form of a standing wave, but in the case of the P4 structure, there was a region where the intensity of the electric field was concentrated. In particular, this phenomenon was prominent in the region having a nanostructure at a wavelength of 675 nm because the surface plasmon polaritons were generated by the coupling effect with light of the corresponding wavelength by the nanostructure. As a result, it could be appreciated that the efficiency of the perovskite solar cell was increased by improving the light absorption efficiency.

In addition, in order to confirm the reproducibility of these results, the efficiencies of 40 perovskite solar cells having a flat structure and a P4 structure were measured. The results are summarized in Table 3. The histograms of the short-circuit current densities and the photoelectric conversion efficiencies of the 40 perovskite solar cells having a flat structure and a P4 structure are illustrated in FIGS. 8A and 8B, respectively.

TABLE 3

| | | Voc (V) | Jsc (mA cm$^{-2}$) | FF (%) | PCE (%) |
|---|---|---|---|---|---|
| Flat | Champion | 1.23 | 15.6 | 73.3 | 14.1 |
| | Average | 1.21 ± 0.02 | 15.5 ± 0.6 | 72.6 ± 3.3 | 13.7 ± 0.4 |
| P4 | Champion | 1.22 | 16.5 | 74.7 | 15.0 |
| | Average | 1.21 ± 0.02 | 16.3 ± 0.3 | 71.4 ± 4.8 | 14.2 ± 0.8 |

Figure 8A:
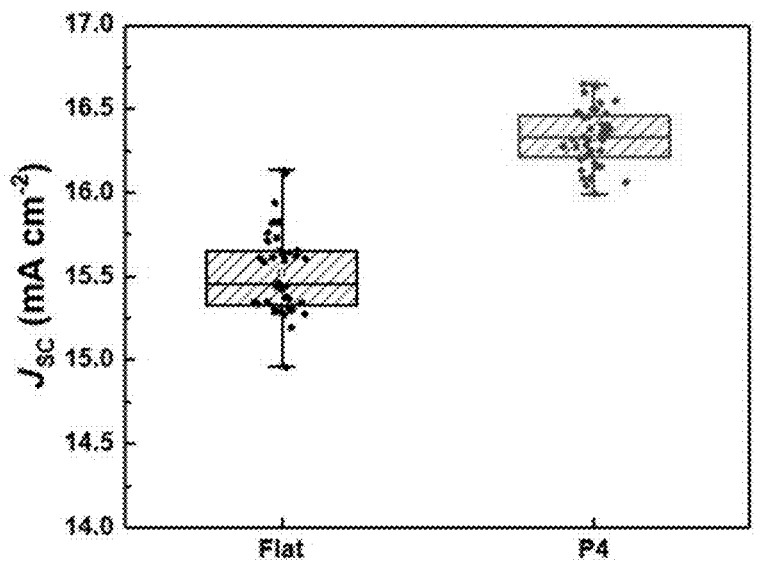
FIGS. 8A and 8B are views illustrating histograms of short-circuit current densities and photoelectric conversion efficiencies of 40 perovskite solar cells having a flat structure and a P4 structure, respectively.
Figure 8B:
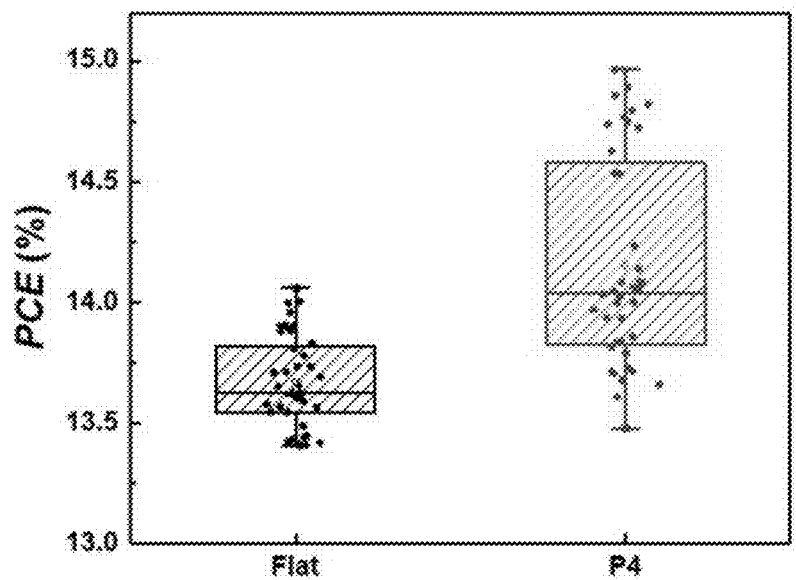

As can be seen in Table 3 and FIGS. 8A and 8B, it was confirmed that the improvement of the efficiency of the perovskite solar cell including the back electrode having a nanostructure derived from the P4 patterns included in the organic hole transport layer was excellently reproduced.

Therefore, in order to improve the efficiency of the quantum dot-based perovskite solar cell, it can be appreciated that shapes of the nanopatterns having a height at which the light absorption efficiency may be improved by the nanopatterns included in the organic hole transport layer and the back electrode deposited on the organic hole transport layer may be conformally coated should be provided.

As set forth above, as the inorganic perovskite solar cell according to an exemplary embodiment of the present invention includes: the electron transport layer that is disposed on the transparent electrode; the photoactive layer having a flat structure that is disposed on the electron transport layer and includes inorganic perovskite quantum dots; the organic hole transport layer that is disposed on the photoactive layer and includes nanopatterns; and the back electrode that is disposed on the organic hole transport layer, even though the photoactive layer has a limited thickness, the light absorption capacity is increased, such that a photoelectric conversion efficiency superior to that of the related art may be provided.

Hereinabove, although the present invention has been described by specific matters and limited exemplary embodiments, they have been provided only for assisting in the entire understanding of the present invention. Therefore, the present invention is not limited to the above exemplary embodiments. Various modifications and changes may be made by those skilled in the art to which the present invention pertains from this description.

Therefore, the spirit of the present invention should not be limited to the described exemplary embodiments, but the claims and all modifications equal or equivalent to the claims are intended to fall within the spirit of the present invention.

What is claimed is:

1. An inorganic perovskite solar cell comprising:
   an electron transport layer that is disposed on a transparent electrode;
   a photoactive layer having a flat structure that is disposed on the electron transport layer and includes inorganic perovskite quantum dots;
   an organic hole transport layer that is disposed on the photoactive layer and includes nanopatterns; and
   a back electrode that is disposed on the organic hole transport layer,
   wherein the nanopatterns are one-dimensional (1D) grid patterns,
   wherein a height of the 1D grid patterns is 40 nm or more and less than 50 nm, and
   wherein an interval between the 1D grid patterns is 420 nm to 450 nm.

2. The inorganic perovskite solar cell of claim 1, wherein a thickness of the photoactive layer is 100 to 400 nm.

3. The inorganic perovskite solar cell of claim 1, wherein the organic hole transport layer contains spiro-MeOTAD.

4. The inorganic perovskite solar cell of claim 1, wherein a thickness of the back electrode is 100 to 350 nm.

5. The inorganic perovskite solar cell of claim 1, wherein the back electrode has a nanostructure derived from the nanopatterns.

6. The inorganic perovskite solar cell of claim 5, wherein the back electrode having the nanostructure is coupled with light at a wavelength of 580 to 700 nm to generate surface plasmon polaritons.

7. The inorganic perovskite solar cell of claim 1, wherein the height of the 1D grid patterns is 40 nm.

* * * * *